United States Patent
Kelly et al.

(10) Patent No.: US 8,802,499 B2
(45) Date of Patent: Aug. 12, 2014

(54) METHODS FOR TEMPORARY WAFER MOLDING FOR CHIP-ON-WAFER ASSEMBLY

(71) Applicants: Michael G. Kelly, San Tan Valley, AZ (US); David Jon Hiner, Chandler, AZ (US); Ronald Patrick Huemoeller, Gilbert, AZ (US)

(72) Inventors: Michael G. Kelly, San Tan Valley, AZ (US); David Jon Hiner, Chandler, AZ (US); Ronald Patrick Huemoeller, Gilbert, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 13/678,026

(22) Filed: Nov. 15, 2012

(65) Prior Publication Data
US 2014/0134800 A1 May 15, 2014

(51) Int. Cl.
*H01L 21/00* (2006.01)

(52) U.S. Cl.
USPC .......... 438/113; 438/125; 438/126; 438/127; 257/E21.001

(58) Field of Classification Search
USPC .................. 438/113; 257/E21.001
See application file for complete search history.

(56) References Cited

U.S. PATENT DOCUMENTS

| | | |
|---|---|---|
| 2011/0057677 A1 | 3/2011 | Black et al. |
| 2012/0119373 A1 | 5/2012 | Hunt |
| 2012/0238057 A1* | 9/2012 | Hu et al. .............. 438/107 |
| 2012/0280374 A1 | 11/2012 | Choi et al. |
| 2013/0187258 A1* | 7/2013 | Lu et al. .............. 257/621 |
| 2013/0217188 A1* | 8/2013 | Wang et al. .............. 438/118 |

* cited by examiner

*Primary Examiner* — Angel Roman
(74) *Attorney, Agent, or Firm* — McAndrews, Held & Malloy

(57) ABSTRACT

Methods for temporary wafer molding for chip-on-wafer assembly may include bonding one or more semiconductor die to an interposer wafer, applying a temporary mold material to encapsulate the bonded die, and backside processing the interposer, which may be singulated to generate assemblies comprising the bonded die, the interposer die, which may be bonded to packaging substrates. The temporary mold material may be removed and the bonded die may be tested. Additional die may be bonded to the assemblies based on the electrical testing. The interposer may be singulated utilizing one or more of: a laser cutting process, reactive ion etching, a sawing technique, and a plasma etching process. The backside processing may comprise thinning the interposer wafer to expose through-silicon-vias (TSVs) and placing metal contacts on the exposed TSVs. The die may be bonded to the interposer utilizing a mass reflow or thermal compression process.

20 Claims, 10 Drawing Sheets

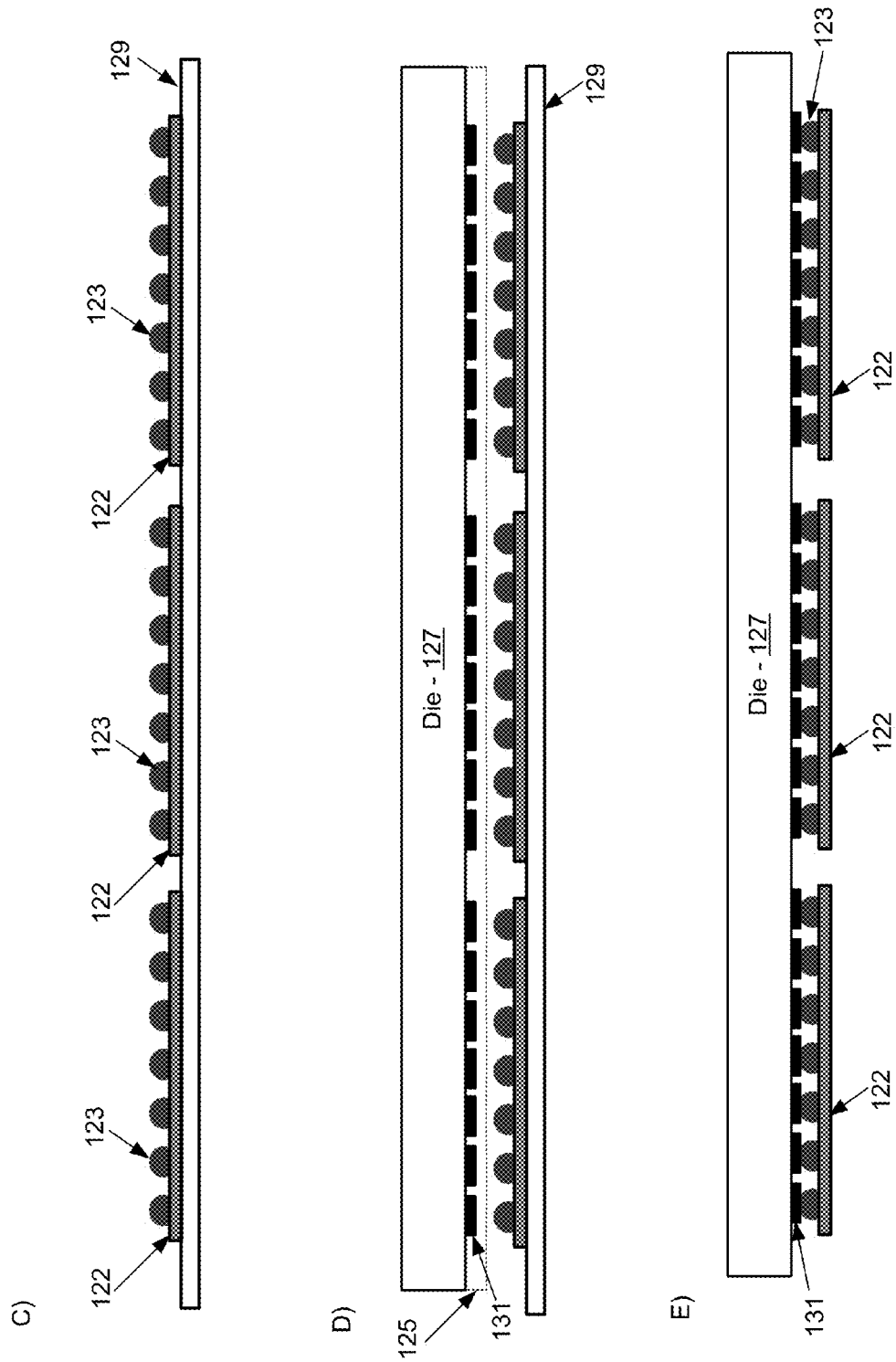

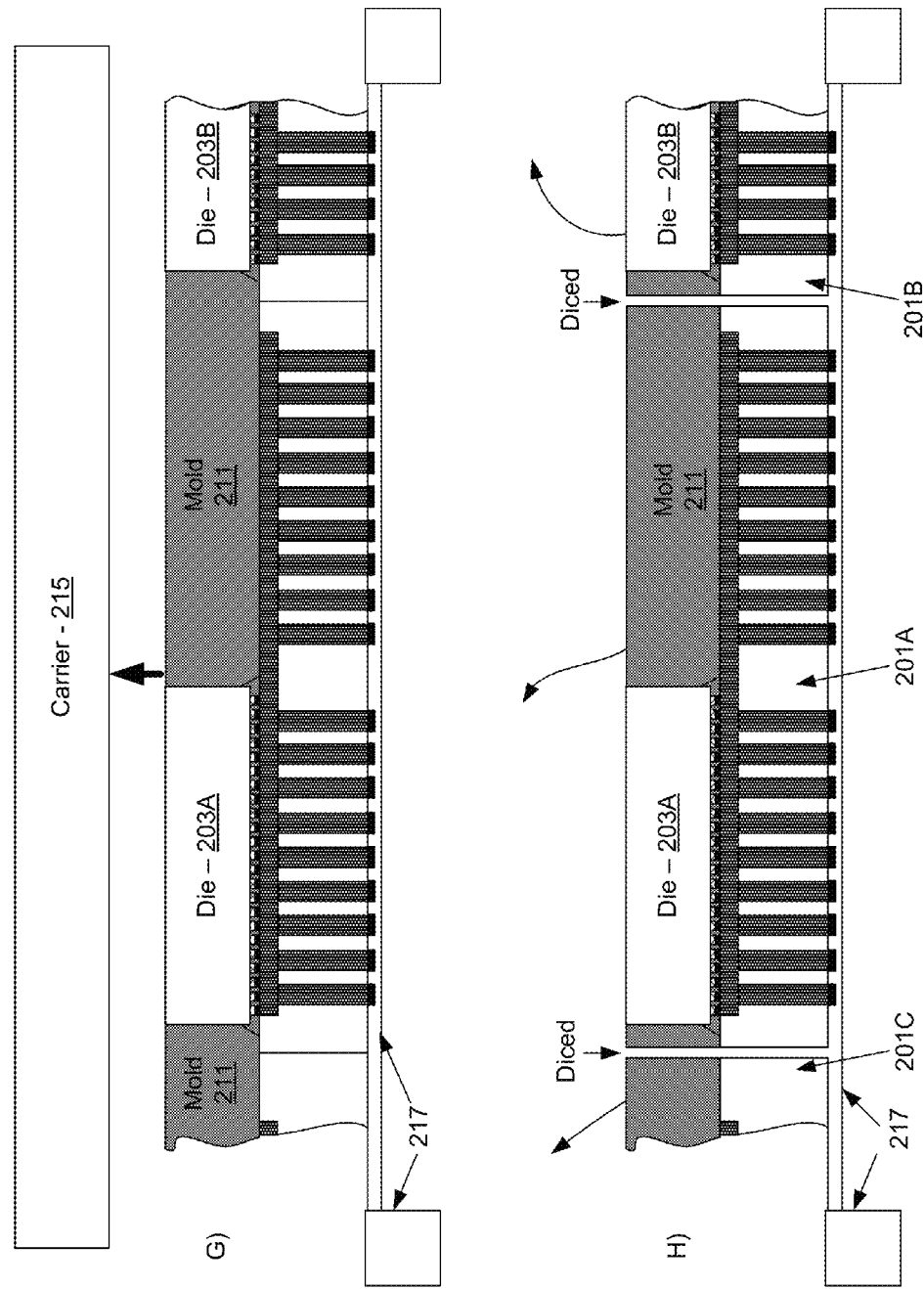

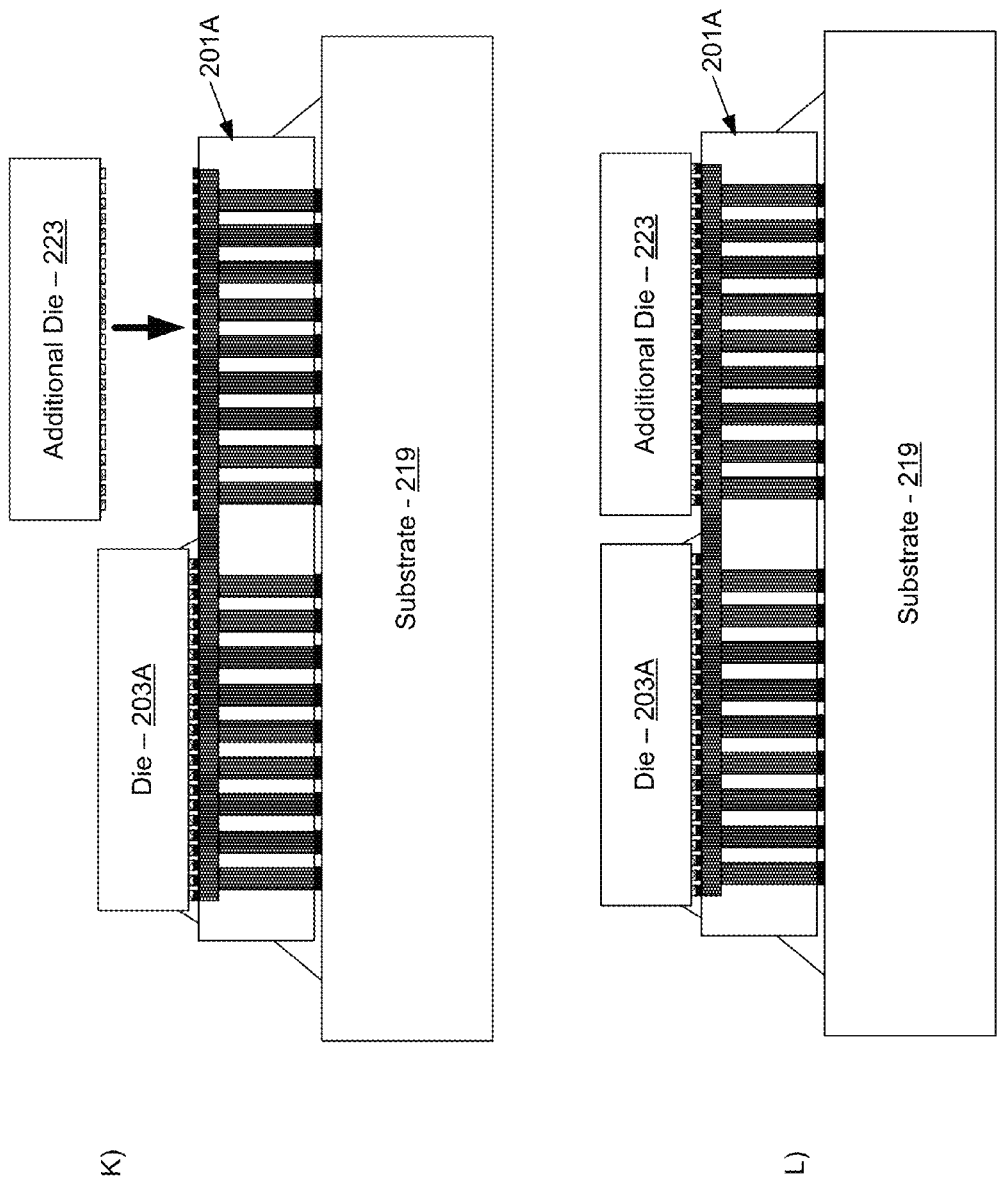

US 8,802,499 B2

METHODS FOR TEMPORARY WAFER MOLDING FOR CHIP-ON-WAFER ASSEMBLY

CROSS-REFERENCE TO RELATED APPLICATIONS/INCORPORATION BY REFERENCE

This application makes reference to U.S. application Ser. No. 12/678,046, filed on even date herewith, which is hereby incorporated herein by reference in its entirety.

FIELD OF THE INVENTION

Certain embodiments of the invention relate to semiconductor chip packaging. More specifically, certain embodiments of the invention relate to methods for temporary wafer molding for chip-on-wafer assembly.

BACKGROUND OF THE INVENTION

Semiconductor packaging protects integrated circuits, or chips, from physical damage and external stresses. In addition, it can provide a thermal conductance path to efficiently remove heat generated in a chip, and also provide electrical connections to other components such as printed circuit boards, for example. Materials used for semiconductor packaging typically comprise ceramic or plastic, and form-factors have progressed from ceramic flat packs and dual in-line packages to pin grid arrays and leadless chip carrier packages, among others.

Further limitations and disadvantages of conventional and traditional approaches will become apparent to one of skill in the art, through comparison of such systems with the present invention as set forth in the remainder of the present application with reference to the drawings.

BRIEF DESCRIPTION OF SEVERAL VIEWS OF THE DRAWINGS

FIGS. 1C-1E illustrate example steps for bonding multiple die utilizing an adhesive film, in accordance with an example embodiment of the invention.

FIGS. 2A-2L illustrate example steps in a die to interposer wafer bond with a temporary mold material process, in accordance with an example embodiment of the invention.

DETAILED DESCRIPTION OF THE INVENTION

Certain aspects of the invention may be found in methods for temporary wafer molding for chip-on-wafer assembly. Example aspects of the invention may comprise bonding one or more semiconductor die to an interposer wafer, applying a temporary mold material to encapsulate the one or more bonded semiconductor die, and backside processing the interposer wafer. The interposer wafer may be singulated to generate a plurality of assemblies each comprising at least one of the bonded one or more semiconductor die and an interposer die, and one or more of the plurality of assemblies may be bonded to one or more packaging substrates. The temporary mold material may be removed and the bonded one or more semiconductor die may be tested. The mold material 211 may be removed utilizing a solvent. One or more additional die may be bonded to one or more of the plurality of assemblies based on the electrical testing. One or more semiconductor die may be placed on the interposer wafer for the bonding utilizing an adhesive film. The interposer wafer may be singulated utilizing one or more of: a laser cutting process, reactive ion etching, a sawing technique, and a plasma etching process. The backside processing may comprise thinning the interposer wafer to expose through-silicon-vias (TSVs) and placing metal contacts on the exposed TSVs. The one or more semiconductor die may be bonded to the interposer wafer utilizing a mass reflow process or a thermal compression process. The one or more additional die may be bonded to the singulated interposer wafer utilizing a reflow process or a thermal compression process. The interposer wafer may be singulated to generate the plurality of assemblies with the interposer wafer bonded to an adhesive film.

Figure 1A:
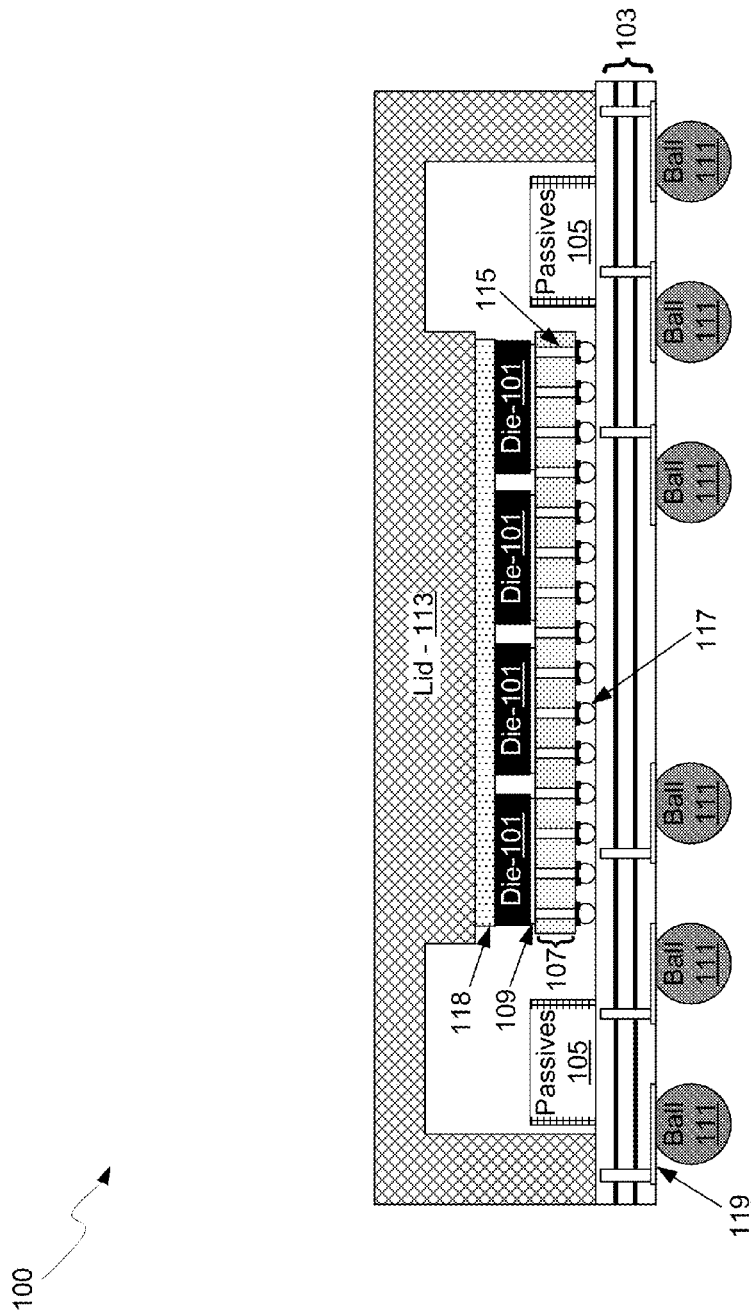
FIG. 1A is a drawing illustrating an integrated circuit package configured utilizing a temporary wafer molding, in accordance with an example embodiment of the invention

FIG. 1A is a drawing illustrating an integrated circuit package configured utilizing a temporary wafer molding, in accordance with an example embodiment of the invention. Referring to FIG. 1A, there is shown a package 100 comprising a plurality of die 101, a packaging substrate 103, passive devices 105, an interposer 107, solder balls 111, a lid 113, and thermal interface material 118.

The plurality of die 101 may comprise integrated circuit die that have been separated from one or more semiconductor wafers. The plurality of die 101 may comprise electrical circuitry such as digital signal processors (DSPs), network processors, power management units, audio processors, RF circuitry, wireless baseband system-on-chip (SoC) processors, sensors, and application specific integrated circuits, for example. In addition, the plurality of die 101 may comprise micro-bumps 109 for providing electrical contact between the circuitry in the plurality of die 101 and contact pads on the surface of the interposer 107. While four separate die are shown in FIG. 1A, it is noted that any number of die may be utilized, even a single die, based on functionality, available interposer area, and die size, for example.

The interposer 107 may comprise a semiconductor wafer, such as a silicon wafer, with through-silicon-vias (TSVs) 115 that provide electrically conductive paths from one surface of the interposer 107 to the opposite surface. The interposer 107 may also comprise backside bumps 117 for making electrical and mechanical contact to the packaging substrate 103. In another example scenario, the interposer 107 may comprise glass or an organic laminate material, either of which may be capable of large panel formats on the order of 500×500 mm, for example.

The packaging substrate 103 may comprise a mechanical support structure for the interposer 107, the plurality of die 101, the passive devices 105, and the lid 113. The packaging substrate 103 may comprise solder balls 111 on the bottom surface for providing electrical contact to external devices and circuits, for example. The packaging substrate 103 may also comprise conductive traces in a non-conductive material for providing conductive paths from the solder balls to the die 101 via pads that are configured to receive the backside bumps 117 on the interposer 107. Additionally, the packaging substrate 103 may comprise pads 119 for receiving the solder balls 111. The pads 119 may comprise one or more underbump metals, for example, for providing a proper electrical and mechanical contact between the packaging substrate 103 and the solder balls 111.

The passive devices 105 may comprise electrical devices such as resistors, capacitors, and inductors, for example, which may provide functionality to devices and circuits in the die 101. The passive devices 105 may comprise devices that may be difficult to integrate in the integrated circuits in the die 101, such as high value capacitors or inductors. In another example scenario, the passive devices 105 may comprise one or more crystal oscillators for providing one or more clock signals to the die 101.

The lid 113 may provide a hermetic seal for the devices within the cavity defined by the lid 113 and the packaging substrate 103. A thermal interface may be created for heat transfer out of the plurality of die 101 to the lid 113 via the thermal interface material 118, which may also act as an adhesive.

In an example scenario, the package 100 may be fabricated by first bonding the plurality of die 101 to the interposer 107 when the interposer 107 is still part of a full wafer of interposer die, and may be bonded utilizing a mass reflow or thermal compression process. The interposer wafer with the plurality of die 101 attached may then be processed for further assembly.

Figures 2A, 2B:
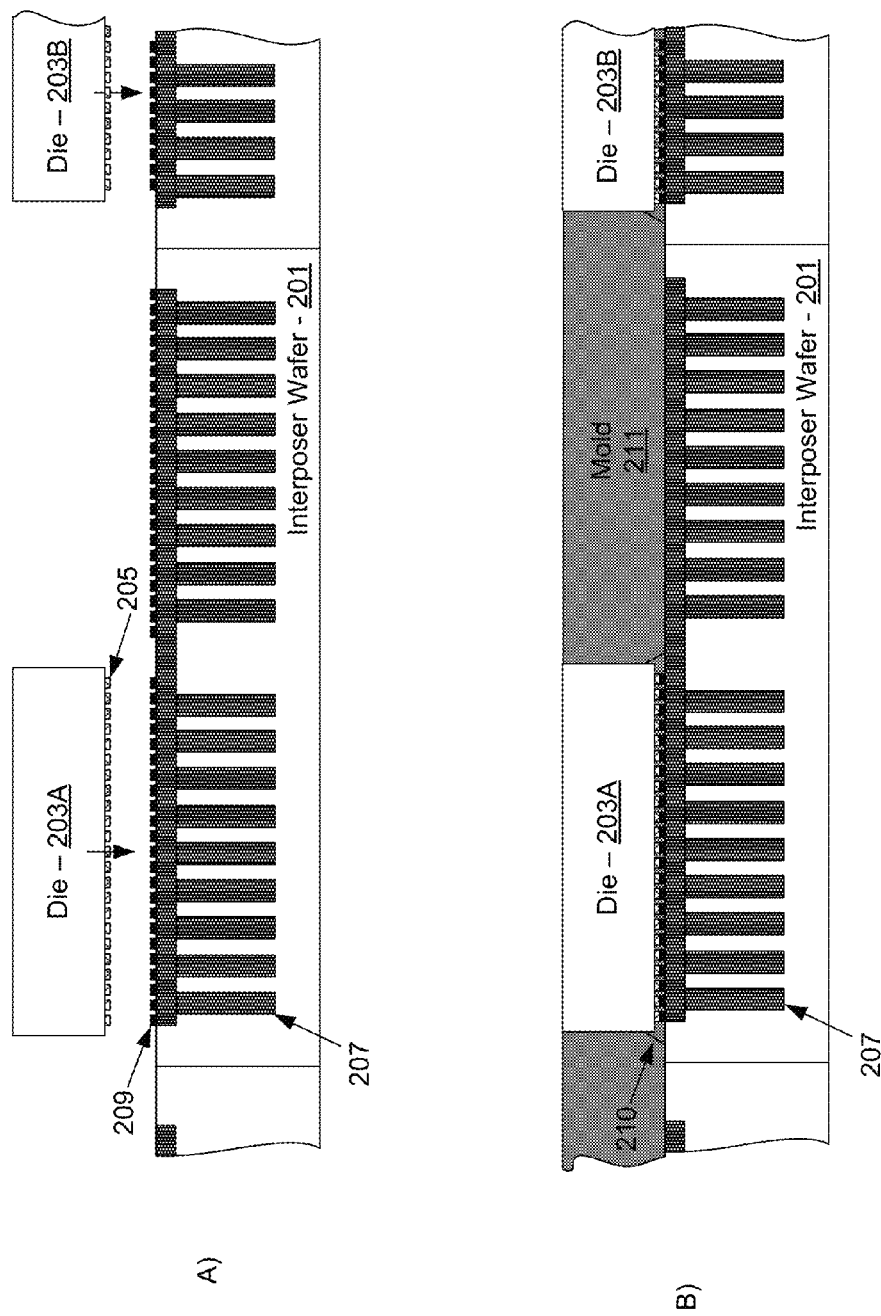
Figures 2C, 2D:
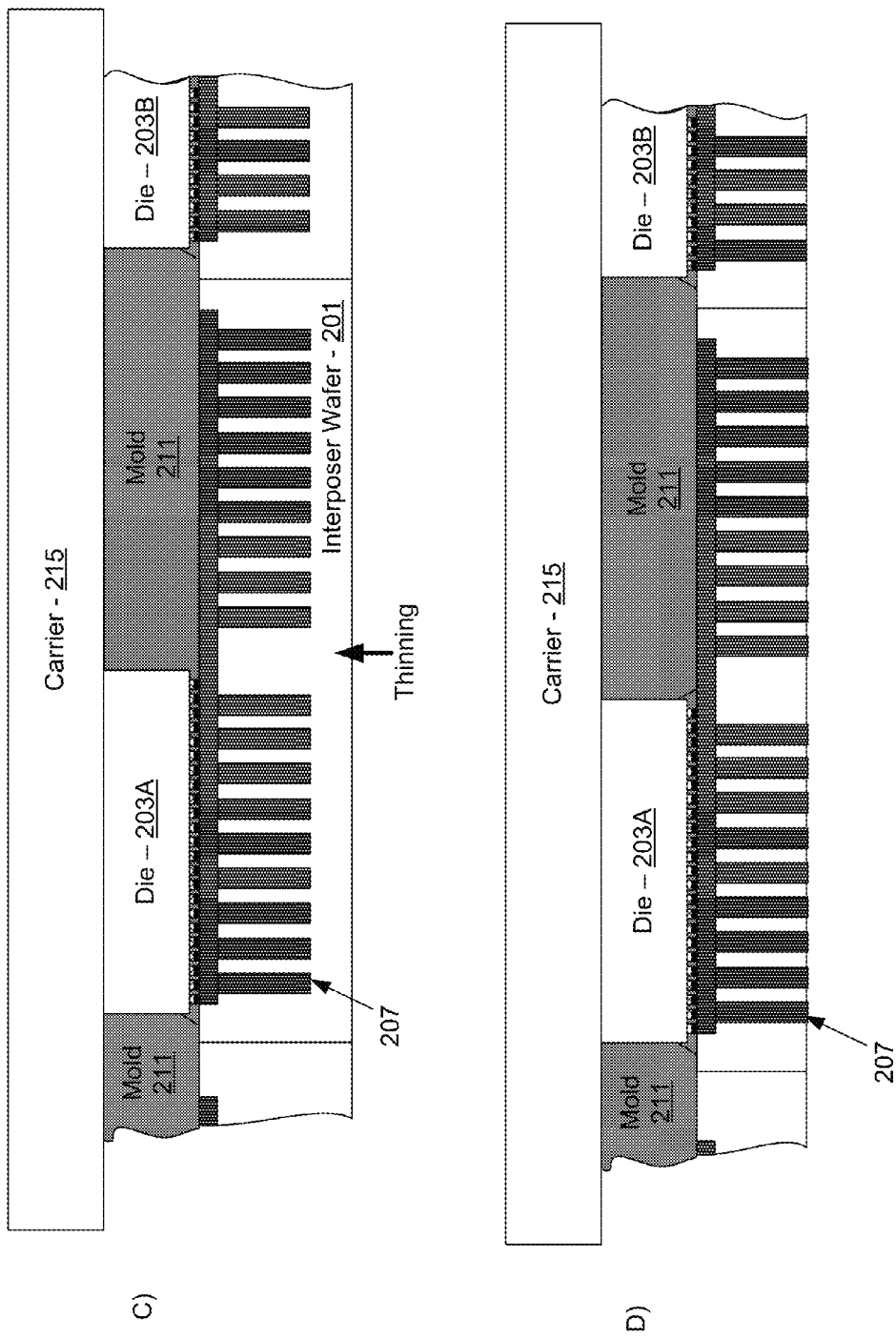
Figures 2E, 2F:
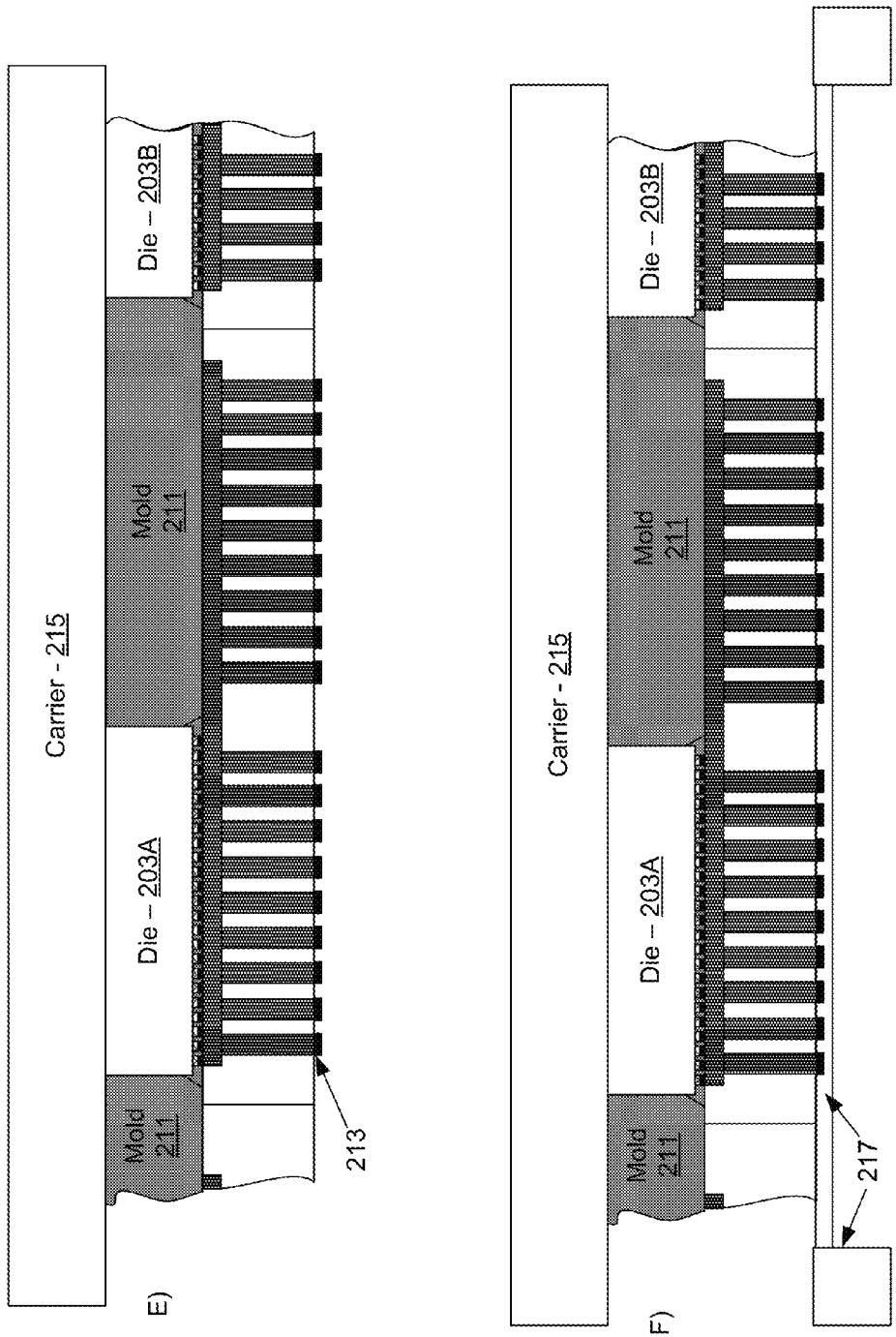

In an example embodiment, a temporary mold material may be utilized to encapsulate the plurality of die 101 after the plurality of die 101 have been coupled to an interposer wafer, as illustrated in FIG. 2B. Once encapsulated, the interposer wafer may be coupled to a carrier die side down so that the backside of the interposer wafer may be thinned, for example to expose the TSV's 115 to enable the deposition of backside bumps 117, as shown in FIGS. 2C-2E. Once the backside bumps 117 are applied, the interposer wafer may be affixed to an adhesive film and support ring as shown in FIG. 2F, and the carrier may be removed as shown in FIG. 2G. The interposer wafer may then be singulated via a dicing process, resulting in singulated assemblies comprising one or more of the plurality of die 101 on an interposer die, which may then be removed from the adhesive layer, as shown in FIG. 2H.

The singulated assembly may then be bonded to the packaging substrate 103 utilizing either mass reflow or thermal compression. In instances where not all of the plurality of die 101 have been placed on the interposer 107 in the first bond process described above, the bonded die may be subjected to electrical testing before bonding the remaining die. This may be advantageous in instances where significant cost differences between die make it desirable to bond and test the lower cost die before bonding the more costly die. After the bonded die have been tested, the remaining die may be bonded to the interposer 107 and a capillary underfill may be applied to fill the volume between the plurality of die 101 and the interposer 107.

Once the plurality of die 101 are bonded to the interposer 107, the lid 113 may be placed on the bonded assembly to provide a hermetic seal and protect the circuitry from the external environment. Finally, electrical tests may be performed on the remaining die following the bonding processes to verify that proper electrical connections were made and no shorts or open circuits exist.

Figure 1B:
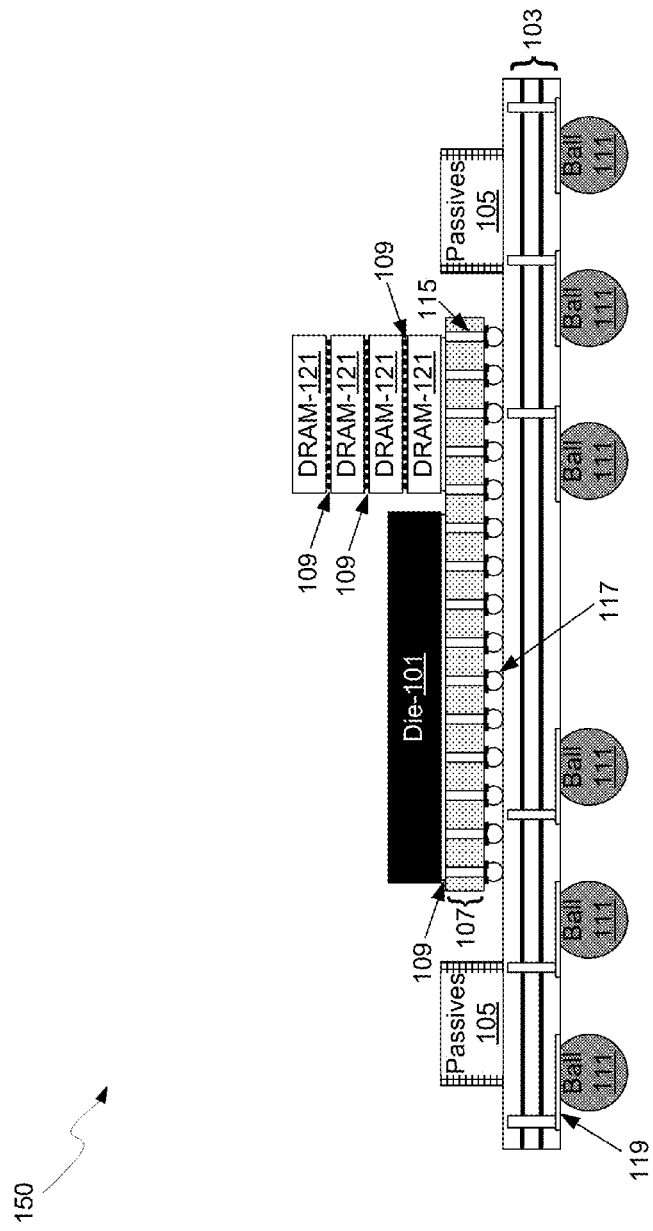
FIG. 1B is a drawing illustrating an integrated circuit package configured with a die to interposer wafer first bond and stacked die, in accordance with an example embodiment of the invention.

FIG. 1B is a drawing illustrating an integrated circuit package configured with a die to interposer wafer first bond and stacked die, in accordance with an example embodiment of the invention. Referring to FIG. 1B, there is shown a package 150 comprising the plurality of die 101, the packaging substrate 103, the passive devices 105, the interposer 107, and a stack of dynamic random access memory (DRAM) 121. The plurality of die 101, the packaging substrate 103, the passive devices 105, and the interposer 107 may be substantially as described with respect to FIG. 1A, for example, but with different electrical connectivity for different ones of the plurality of die 101 and the stack of DRAM 121.

The stack of DRAM 121 may, for example, comprise a stack of die for providing a high density memory for circuitry in the plurality of die 101 or external to the package 150. The stack of DRAM 121 may, for example, be stacked front-to-back and therefore comprise TSV's for providing electrical connectivity between the individual die.

In an example scenario, the package 150 may be fabricated by first bonding the plurality of die 101 and the stack of DRAM 121 to the interposer 107 when still in wafer form, i.e. before singulation into individual interposer die. The die 101 may be bonded utilizing mass reflow or thermal compression process. As described in FIG. 1A and FIGS. 2A-2L, a temporary mold material may be utilized to encapsulate the die 101 on an interposer wafer for further processing and testing before bonding the stack of DRAM 121 (e.g., to the interposer 107 in singulated or in wafer form).

Once encapsulated in the temporary mold material, the interposer wafer may be coupled to a carrier die side down so that the backside of the interposer wafer may be thinned, for example to expose the TSV's 115 to enable the deposition of backside bumps 117, as shown in FIGS. 2C-2E. Once the backside bumps 117 are applied, the interposer wafer may be affixed to an adhesive film and support ring as shown in FIG. 2F, and the carrier may be removed as shown in FIG. 2G. The interposer wafer may then be singulated via a dicing process, for example, resulting in singulated assemblies comprising one or more of the plurality of die 101 on an interposer die, which may then be removed from the adhesive layer, as shown in FIG. 2H. In an example scenario, the singulation process may comprise one or more of: a laser cutting process, reactive ion etching, a sawing technique, and a plasma etching process.

The singulated assembly may then be bonded to the packaging substrate 103 utilizing either a mass reflow or thermal compression process. In instances where only the plurality of die 101 is placed on the interposer 107 in the first bond process described above, the plurality of die 101 may be subjected to electrical testing before bonding the remaining die, namely the stack of DRAM 121. This may be advantageous in instances where significant cost differences between die make it desirable to bond and test the lower cost die before bonding the more costly die, such as when the stack of DRAM 121 is much more costly than the plurality of die 101. After the plurality of die 101 has been tested, the stack of DRAM 121 may be bonded to the interposer 107 utilizing a mass reflow or thermal compression process, for example, and a capillary underfill may be applied to fill the volume between the stack of DRAM 121 and the interposer 107.

Once the stack of DRAM 121 is bonded to the interposer 107, a lid may be placed on the bonded assembly, for example to provide a hermetic seal and protect the circuitry from the external environment. As discussed previously with respect to FIG. 1A, in some example embodiments, a thermal interface material may be disposed between the stack of DRAM 121 (and/or the plurality of die 101) and such lid. Finally, electrical tests may be performed on the remaining die following the bonding processes to verify that proper electrical connections were made and no shorts or open circuits exist.

FIGS. 1C-1E illustrate example steps for bonding multiple die utilizing an adhesive film, in accordance with an example embodiment of the invention. Referring to FIG. 1C, there is shown a plurality of die 122 and an adhesive layer 129. Each of the plurality of die 122 may comprise metal interconnects 123 for subsequent bonding to other die. In another example scenario, the metal interconnects 123 may comprise microbumps or copper pillars, for example.

The adhesive film 129 may comprise an adhesive tape, for example, to which the plurality of die 122 may be bonded (e.g., adhered), as illustrated in FIG. 1C. The adhesive film 129 may, for example, be a temporary adhesive for attaching multiple die (e.g., previously singulated die) to other die within a wafer. For example. The interposer 127 may comprise a wafer of individual interposer die (in which case the interposer 127 comprises an "interposer wafer"). In an example scenario, the plurality of die 122 may be placed temporarily on the adhesive film 129. While FIG. 1C illustrates the plurality of die 122 as consisting of three die, more or less die (including a single die) are also possible and contemplated.

An optional underfill material 125 may also be placed on the interposer wafer 127 as illustrated by underfill material 125 in FIG. 1D, before bonding the plurality of die 121 to the interposer 127 utilizing the adhesive film 129. The underfill material 125 may be for subsequent thermal compression bonding processes, for example, and may allow instant underfill through a snap cure during a subsequent thermal compression bonding process. The underfill material 125 may, for example, comprise paste, tape, etc. This may improve bonding yields since a single underfill process may be utilized for the plurality of die 122 as compared to a separate place and underfill process for each of the die 122. The plurality of die 122 may be placed face up on the adhesive film so that the metal interconnects 123 on the faces of the plurality of die 122 may be coupled to a receiving die.

The plurality of die 122 on the adhesive film 129 may then be placed on the interposer 127, as shown in FIGS. 1D and 1E, where the initial placement of the plurality of die 122 on the adhesive film 129 may enable fine control of the spacing and alignment of the plurality of die 122 with the interposer 127. The interposer 127 may comprise metal pads 131 for receiving the metal interconnects 123. Once the plurality of die 122 are placed on the interposer 127, a bond process (e.g., a thermal compression bond process) may be performed for proper electrical and mechanical bonds between the metal interconnects 123 and the metal pads 131. Once bonded, the adhesive film 129 may be removed resulting in the structure shown in FIG. 1E.

Though the previous discussion of FIGS. 1C-1E (and other discussions herein) focused on the utilization of adhesive film for holding die while such die are placed and/or bonded, various aspects of the present invention readily extend to other structures that may be used for holding such die. Additionally, though the previous discussion (and other discussions herein) generally focused on the attachment of die to an interposer wafer, the various aspects of the present invention, readily extend to other types of wafers. Further, though the previous discussion (and other discussions herein) generally focused on the utilization of adhesive for holding die while such die are placed and/or bonded, various aspects of the present invention readily extend to electrical components other than semiconductor die.

FIGS. 2A-2L illustrate example steps in a die to interposer wafer bond with a temporary mold material process, in accordance with an example embodiment of the invention. Such steps may, for example, be utilized to produce the various packages illustrated in FIGS. 1A and 1B, and/or subassemblies thereof.

Referring to FIG. 2A, there is shown an interposer wafer 201 and die 203A and 203B. The die 203A and 203B may comprise integrated circuit die that have been separated from one or more semiconductor wafers. The die 203A and 203B may comprise electrical circuitry such as digital signal processors (DSPs), network processors, power management units, audio processors, RF circuitry, wireless baseband system-on-chip (SoC) processors, sensors, and application specific integrated circuits, for example. In addition, the die 203A and 203B may comprise micro-bumps 205 for providing electrical contact between the circuitry in the die 203A and 203B and front side pads 209 on the surface of the interposer wafer 201.

The interposer wafer 201 may comprise a plurality of individual interposer die, each of which may be coupled to one or more die, such as the die 203A and 203B. The vertical lines in the interposer wafer 201 indicate where the interposer wafer 201 may be diced into a plurality of interposer die. While FIG. 2A shows a single die bonded per interposer die, any number of die is possible and contemplated here, based on space and/or circuitry requirements, for example.

The interposer wafer 201 may also comprise front side pads 209 for providing electrical contact to the die 203A and 203B, as well as future bonded die or other electrical components. Furthermore, the interposer wafer 201 may comprise through-silicon-vias (TSVs) 207 for providing electrically conductive paths from one surface of the interposer to the other, for example once the interposer wafer 201 has been thinned.

The die 203A and 203B may be placed on the interposer wafer 201 and bonded using a thermal compression bonding technique, for example. In another example scenario, a mass reflow process may be utilized to bond the die 203A and 203B to the interposer wafer 201. A non-conductive paste (NCP) or film may also be utilized to assist in forming the bonds. In addition (or instead), a capillary underfill may then be applied and may fill the volume between the die 203A and 203B and the interposer wafer 201. FIG. 2B illustrates the die 203A and 203B bonded to the interposer wafer 201 with underfill material 210.

The space between the die 203A and 203B may be filled with a mold material 211, as illustrated in FIG. 2B. The mold material 211 may comprise a polymer material, for example, that may provide a non-conductive structural support for die bonded to the interposer wafer 201, protecting the die in subsequent processing steps and when diced into individual packages. Though not shown in FIG. 2B, the mold material may also be deposed on top of the die 203A and 203B.

The mold material 211 may comprise characteristics of any of a variety of different types of mold material. For example and without limitation, the mold material 211 may be thermoplastic material that may be dissolved utilizing a solvent, thereby enabling temporary uses of the molding. The mold material 211 may be cured, at least partially, at an elevated temperature while under pressure from a plunger mechanism.

FIG. 2C illustrates the molded assembly of FIG. 2B placed on a support structure, such as the carrier 215, for example. The carrier 215 may, for example, comprise a porous material for subsequent solvent-based removal, and may be bonded to the top of the die 203A and 203B and/or the mold material 211, for example to assist with backside processing of the interposer wafer 201.

In an example scenario, the interposer wafer 201 may be thinned utilizing a back side polish or grind, for example, to expose the TSVs 207, as illustrated in FIG. 2D. In another example scenario, the interposer wafer 201 may be thinned to a thickness where the TSVs are still slightly covered. In such an example scenario, the interposer wafer 201 may then be etched selectively in areas covering the TSVs 207 to reveal the TSVs 207. A protective layer may then be deposited over the remaining silicon and a polish of the exposed TSVs may be performed for improved contact to the TSVs. Additionally, metal pads may be deposited on the polished TSVs for better contact with the backside bumps 213 shown in FIG. 2E.

After the interposer wafer 201 has been thinned, the backside bumps 213 may be deposited, as shown in FIG. 2E, for making contact between the TSVs and subsequently bonded substrates, such as packaging substrates. Following the deposition of the backside bumps 213, an adhesive film support 217 may be affixed to the back surface of the thinned interposer wafer, as shown in FIG. 2F. The adhesive film support 217 may comprise a thin adhesive film surrounded by a support frame, where the adhesive film may be pressed against the thinned interposer wafer and backside bumps 213. This may, for example, enhance ease of handling during subsequent processing of the die side of the molded wafer. Accordingly, the carrier 215 may be removed as shown in FIG. 2G. In an example scenario, the carrier 215 may be removed by heating and mechanical force, or utilizing a chemical solvent, for example.

The molded assembly (e.g., comprising the die 203A and 203B, the mold material 211, and the interposer wafer 211) may then be singulated utilizing a cutting technology such as reactive ion etching, plasma etching (e.g. an inductively coupled plasma), laser cutting, or mechanical saw. In an example scenario, the molded assembly may be partially cut and then separated with a mechanical pulling apart of the die, resulting in singulated interposer die (and assemblies including such die), as illustrated by the interposer die 201A-201C.

Figures 2I, 2J:
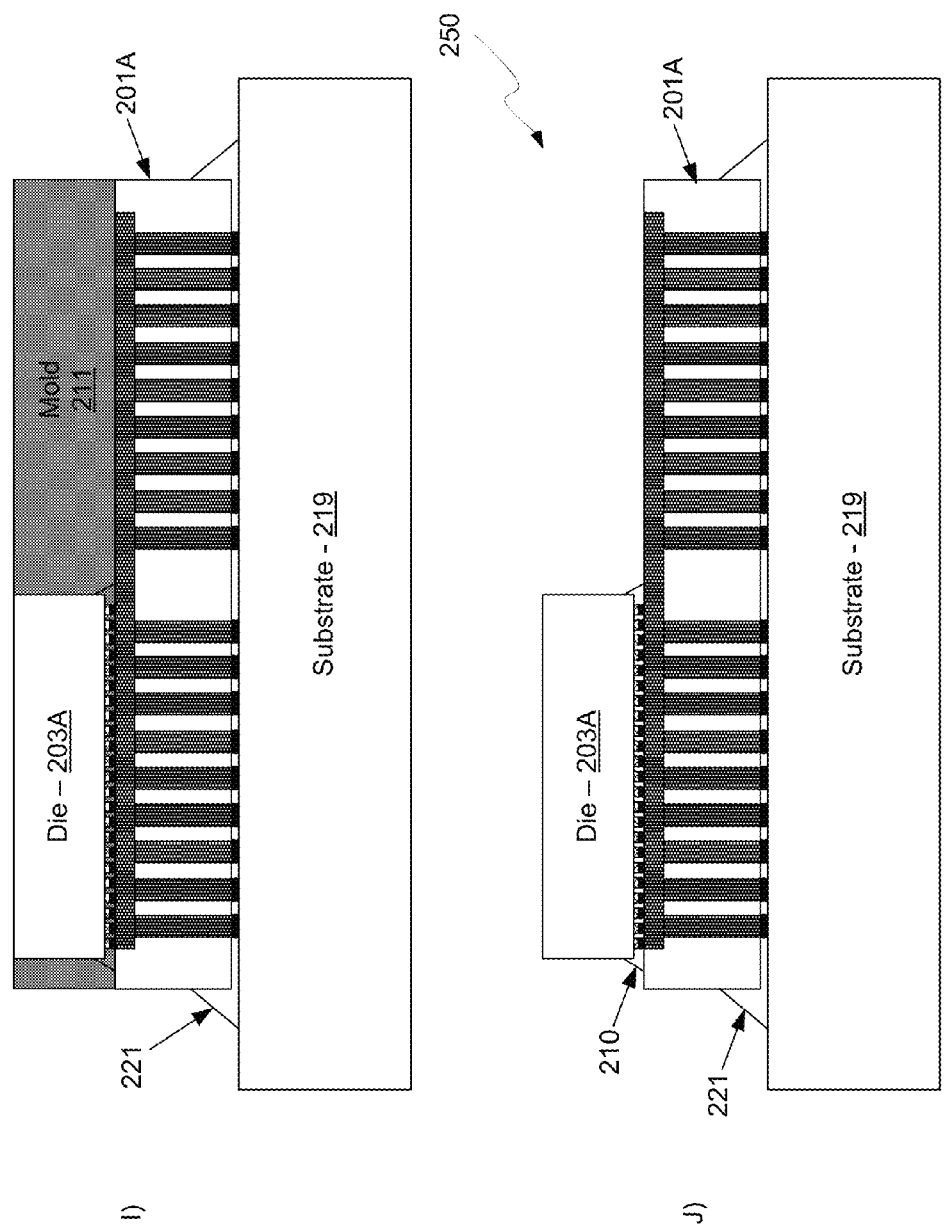

Each of the singulated molded die/interposer assemblies, as illustrated by the die 203A, the interposer die 201A, and the mold material 211 attached thereto, may be removed from the adhesive film support 217 and may then be bonded to the packaging substrate 219 (or another substrate) via the backside bumps 213, as illustrated in FIG. 2I. The assembly may be bonded to the substrate 219 utilizing a mass reflow process or a thermal compression process, for example.

The packaging substrate 219 may, for example, comprise contact pads on a front surface for making contact with the backside bumps 213 on the interposer die 201A and on a back surface for placement of solder balls for ultimately bonding the package substrate 219 to a printed circuit board, for example. In addition, an underfill process may be performed on the assembly comprising the die 203A, the interposer die 201A and the packaging substrate 219, resulting in the underfill material 221.

The mold material 211 may then be removed resulting in the assembly 250 illustrated in FIG. 2J. The mold material may comprise a thermoplastic material that may be removed utilizing a solvent, for example. This may be followed by a cleaning step, if necessary.

The die 203A, and thus the electrical interconnects to the die 203A, may then be electrically tested for opens and shorts, and other performance parameters of the die 203A may be assessed before bonding other die to the interposer die 201A. This enables the placement of certain die to the interposer die 201A after much of the processing is completed, which may be particularly desirable when certain die are very costly as compared to other die.

Once the die 203A and associated electrical interconnects have been tested, other die, such as the additional die 223 may be bonded to the interposer die 201A. The additional die 223 may be bonded utilizing a mass reflow process or a thermal compression process, for example. An underfill material may also be placed in the volume between the additional die 223 and the packaging substrate 219 utilizing a capillary underfill process and/or pre-applied underfill, for example.

In an example scenario, the die 203A may comprise controller circuitry, such as a CPU, for example, while the additional die 223 may comprise a stack of DRAM. In this instance, the die 203A may be bonded to the interposer wafer 201 which may then be processed as described above to enable testing of the circuitry in the die 203A before bonding the additional die 223 to the assembly. For example, if the die 203A is not fully functional after processing into an assembly, the assembly can be scrapped without losing the expense of bonding the additional die 223 to the assembly. This may be especially desirable when the additional die 223 is significantly more costly than the die 203A, where the functionality of the die 203A and the associated processing may be tested prior to bonding the additional die 223.

The temporary molding illustrated in FIGS. 2B-2H enables the processing of the assembly by providing a planar top surface for mounting to support structures and general wafer handling. This temporary planarization enables the processing of a subset of the total number of die in an assembly, particularly where certain processes have lower yields and it is advantageous to bond higher cost die after these processes.

In addition, a lid may be placed on the package assembly with a hermetic seal made with an adhesive at the surface of the packaging substrate 219, which may also comprise a thermal interface material. Accordingly, the lid may make contact with the top surfaces of the die 203A and the additional die 223 for thermal heat sinking purposes.

Figure 3:
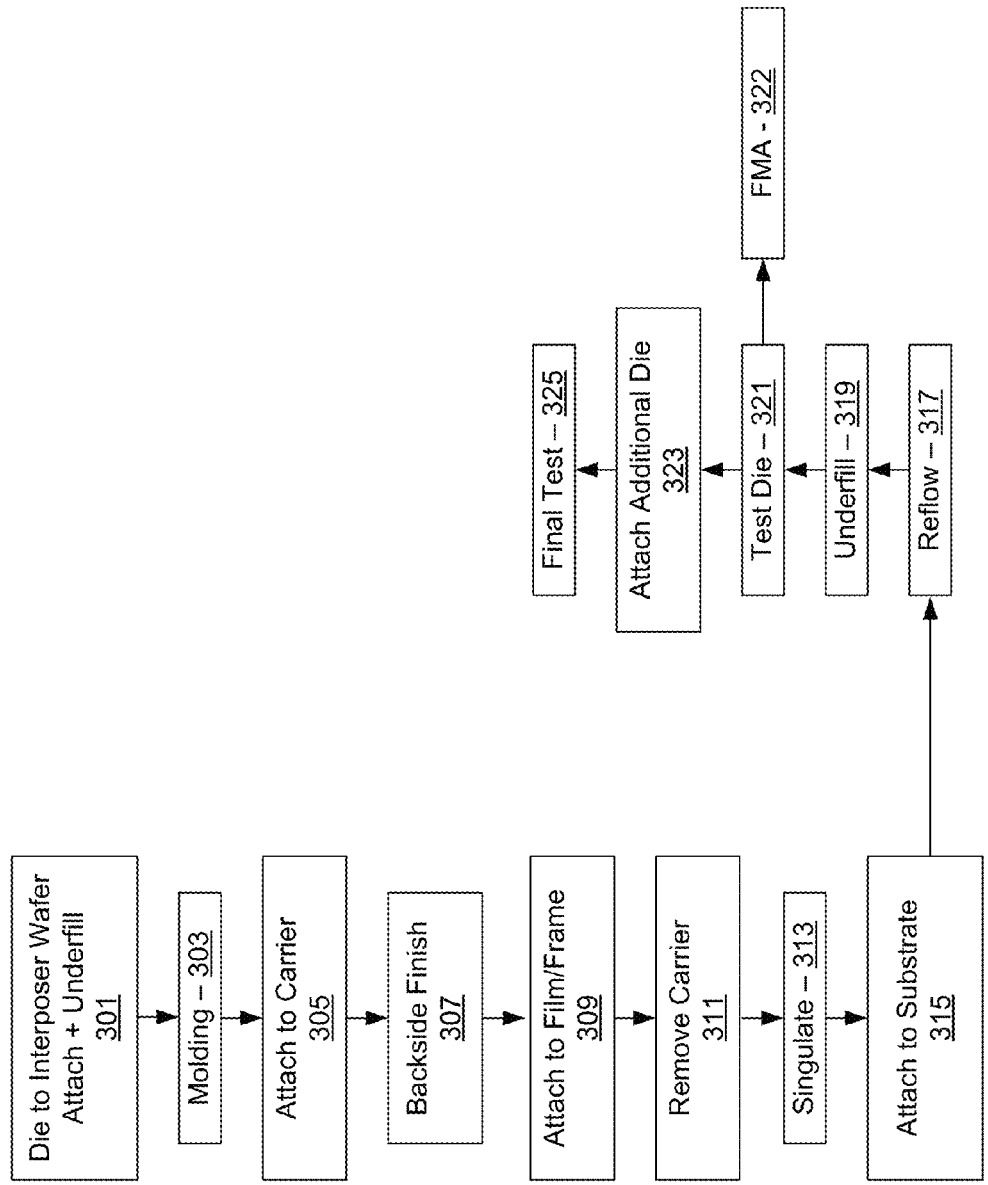
FIG. 3 is a flow diagram illustrating example steps in a die to wafer first bond and temporary mold process, in accordance with an example embodiment of the invention.

FIG. 3 is a flow diagram illustrating example steps in a die to wafer (e.g., an interposer wafer) first bond and temporary mold process, in accordance with an example embodiment of the invention. Such exemplary steps may, for example, include any or all of the steps previously discussed herein with regard to FIGS. 1-2. Referring to FIG. 3, there is shown a die to interposer wafer process beginning with a die to interposer wafer attach and underfill step 301. The one or more die may be bonded utilizing a mass reflow bonding technique, for example. A capillary underfill process may be utilized following the bonding process, which may provide an insulating barrier between contacts and may fill the volume between the die and the interposer wafer. It should be noted that the process is not limited to a mass reflow technique. Accordingly, a thermal compression process may be utilized, for example. Thermal compression bonding techniques may be advantageous at 40 micron pitch or less, which may reduce or eliminate white bumps, i.e. high-k dielectric layer delamination. In addition, flatness may be improved with thermal compression bonding, resulting in fewer open circuit connections due to excessive gaps.

A molding step 303 may then be utilized to planarize the surface at or near the top of the bonded die. In this manner, the interposer wafer may be backside processed even with only a subset of the die bonded to the front side of the interposer wafer. Accordingly, the interposer wafer may be attached to a carrier in step 305 with the die side attached to the carrier.

The interposer wafer may be backside processed in step 307, where the interposer wafer may be thinned to expose the TSVs. In addition, backside contacts may be applied to the exposed TSVs in the interposer wafer. In another example scenario, the interposer wafer may be thinned to a thickness where the TSVs are still slightly covered, which may then be etched selectively in areas covering the TSVs. A protective layer may then be deposited over the remaining silicon and a polish of the exposed TSVs may be performed for improved contact to the TSVs. Additionally, metal pads may be deposited on the polished TSVs for better contact with the backside bumps.

A film frame may then be placed on the back side of the interposer wafer in step 309. The film frame may comprise an adhesive film stretched within a rigid frame, and may enable ease of transport of the molded die and thinned interposer wafer. After the interposer wafer and molded die structure has been bonded to the film frame, the carrier may be removed in step 311. In an example scenario, the carrier comprises a porous structure, such that the carrier may be released utilizing a solvent process, for example.

The molded die/interposer wafer structure may then be singulated into a plurality of molded die on interposer die in the singulate step 313. Singulation may be performed via laser cutting, plasma etching, reactive ion etching, or a sawing technique, for example.

The singulated assemblies may then be attached to substrates (e.g., packaging substrates) in step 315 utilizing backside contacts placed on the exposed TSVs. The resulting die/interposer/packaging substrate assembly may then be subjected to a reflow step 317 where the interposer die to packaging substrate contacts may be reflowed resulting in proper electrical and physical contact. This may be followed by a capillary underfill step 319 filling the volume between the interposer die and the packaging substrate, providing an insulating material between the contacts and filling the void to reject contamination.

The bonded die may be electrically tested in step 321. In this manner, if a die or associated interposer and package has become inoperative or does not have proper performance, the assembly may not proceed to step 323 where additional die may be bonded, but may proceed to a failure mode analysis step 322 to determine performance issues. If the die and associated interposer and packaging pass electrical testing in step 321, additional die may be attached in step 323. The additional die may be bonded utilizing a mass reflow or thermal compression process, for example.

Finally, the bonded package may be subjected to a final test step 325 for assessing the performance of the electronic circuitry in the bonded die and to test the electrical contacts made in the bonding processes. The temporary molding process enables the testing of a subset of die before attaching the remaining die, if desired.

Though the previous discussion of FIGS. 1-3 focused primarily on assemblies and/or subassemblies that include an interposer die or wafer thereof, the various aspects of the present invention are not limited to assemblies and/or subassemblies that include such an interposer die or wafer thereof. For example, the various aspects of the present invention readily extend to a general semiconductor wafer, of which interposer wafer is an example.

In an embodiment of the invention, methods are disclosed for a temporary wafer molding for chip-on-wafer assembly and may comprise bonding one or more semiconductor die (e.g., one or more of the plurality of die 101, die 203A, and die 203B) to an interposer wafer 201, applying a temporary mold material 211 to encapsulate the one or more bonded semiconductor die (e.g., one or more of the plurality of die 101, die 203A, and die 203B), and backside processing the interposer wafer 201. The interposer wafer 201 may be singulated to generate a plurality of assemblies each comprising at least one of the bonded one or more semiconductor die (e.g., one or more of the plurality of die 101, die 203A, and die 203B) and an interposer die 201A and one or more of the plurality of assemblies 250 may be bonded to one or more packaging substrates 219.

The temporary mold material 211 may be removed and the bonded one or more semiconductor die (e.g., one or more of the plurality of die 101, die 203A, and die 203B) may be tested. The mold material 211 may be removed utilizing a solvent. One or more additional die (e.g., one or more of the stack of DRAM 121 and the additional die 223) may be bonded to one or more of the plurality of assemblies 250 based on the electrical testing. One or more semiconductor die (e.g., one or more of the plurality of die 101, die 203A, and die 203B) may be placed on the interposer wafer 201 for the bonding utilizing an adhesive film 129. The interposer wafer 201 may be singulated utilizing one or more of: a laser cutting process, reactive ion etching, a sawing technique, and a plasma etching process.

The backside processing may comprise thinning the interposer wafer 201 to expose through-silicon-vias (TSVs) 207 and placing metal contacts 213 on the exposed TSVs 207. The one or more semiconductor die (e.g., one or more of the plurality of die 101, die 203A, and die 203B) may be bonded to the interposer wafer 201 utilizing a mass reflow process or a thermal compression process. The one or more additional die (e.g., one or more of the stack of DRAM 121 and the additional die 223) may be bonded to the interposer wafer 201 utilizing a reflow process or a thermal compression process. The interposer wafer 201 may be singulated to generate the plurality of assemblies 250 with the interposer wafer 201 bonded to an adhesive film 217.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for semiconductor packaging, the method comprising:
  bonding one or more semiconductor die to an interposer wafer;
  applying a temporary mold material to the one or more bonded semiconductor die;
  backside processing said interposer wafer;
  singulating said interposer wafer to generate a plurality of assemblies each comprising at least one of the bonded one or more semiconductor die and an interposer die;
  bonding one or more of said plurality of assemblies to one or more packaging substrates;
  removing said temporary mold material;
  electrically testing the bonded one or more semiconductor die; and
  bonding one or more additional die to one or more of said plurality of assemblies based on the electrical testing.

2. The method according to claim 1, comprising placing said one or more semiconductor die on said interposer wafer for said bonding utilizing an adhesive film.

3. The method according to claim 1, wherein said singulating said interposer wafer comprises utilizing one or more of: a laser cutting process, reactive ion etching, a sawing technique, and a plasma etching process.

4. The method according to claim 1, wherein said backside processing comprises thinning said interposer wafer to expose through-silicon-vias (TSVs).

5. The method according to claim 4, wherein said backside processing comprises placing metal contacts on the exposed TSVs.

6. The method according to claim 1, wherein said applying a temporary mold material comprises applying said temporary mold material between and over a plurality of the bonded semiconductor die.

7. The method according to claim 1, wherein said removing said temporary mold material comprise removing said temporary mold material after said bonding to packaging substrate.

8. The method according to claim 1, comprising removing said temporary mold material utilizing a solvent.

9. The method according to claim 1, comprising bonding said one or more semiconductor die to said interposer wafer utilizing one or more of: a thermal compression process and a mass reflow process.

10. The method according to claim 1, comprising singulating said interposer wafer to generate said plurality of assemblies with said interposer wafer bonded to an adhesive film.

11. A method for semiconductor packaging, the method comprising:
- bonding one or more semiconductor die to a semiconductor wafer;
- applying a temporary mold material to the one or more bonded semiconductor die;
- after said bonding one or more semiconductor die and said applying a temporary mold material, backside processing said semiconductor wafer;
- singulating said baskside processed semiconductor wafer to generate a plurality of assemblies, each comprising at least one of the bonded one or more semiconductor die, at least a portion of the semiconductor wafer, and at least a portion of the temporary mold material;
- bonding one or more of said plurality of assemblies to one or more packaging substrates;
- removing said temporary mold material;
- electrically testing the bonded one or more semiconductor die; and
- bonding one or more additional die to one or more of said plurality of assemblies based on the electrical testing.

12. The method according to claim 11, comprising placing said one or more semiconductor die on said semiconductor wafer for said bonding utilizing an adhesive film.

13. The method according to claim 11, comprising singulating said semiconductor wafer utilizing one or more of: a laser cutting process, reactive ion etching, a sawing technique, and a plasma etching process.

14. The method according to claim 11, wherein said backside processing comprises thinning said semiconductor wafer to expose through-silicon-vias (TSVs).

15. The method according to claim 14, wherein said backside processing comprises placing metal contacts on the exposed TSVs.

16. The method according to claim 11, wherein said applying a temporary mold material comprises applying said temporary mold material between and over a plurality of the bonded semiconductor die.

17. The method according to claim 11, comprising bonding said one or more semiconductor die to said interposer wafer utilizing one or more of: a thermal compression process and a mass reflow process.

18. The method according to claim 11, comprising bonding said one or more semiconductor die to said semiconductor wafer utilizing one or more of: a thermal compression process and a mass reflow process.

19. The method according to claim 11, comprising removing said mold material utilizing a solvent.

20. A method for semiconductor packaging, the method comprising:
- bonding one or more semiconductor die to an interposer wafer, wherein at least on said one or more semiconductor comprises a central processor unit;
- applying a temporary mold material to encapsulate the one or more bonded semiconductor die;
- after said bonding one or more semiconductor die and said applying a temporary mold material, backside processing said interposer wafer;
- singulating said interposer wafer to generate a plurality of assemblies each comprising at least one of the bonded one or more semiconductor die and an interposer die;
- bonding one or more of said plurality of assemblies to one or more packaging substrates;
- removing said temporary mold material;
- electrically testing the bonded one or more semiconductor die; and
- bonding one or more dynamic random access memory (DRAM) die to one or more of said plurality of assemblies based on the electrical testing.

\* \* \* \* \*